(12) United States Patent
Mayer et al.

(10) Patent No.: US 7,531,079 B1
(45) Date of Patent: May 12, 2009

(54) METHOD AND APPARATUS FOR UNIFORM ELECTROPOLISHING OF DAMASCENE IC STRUCTURES BY SELECTIVE AGITATION

(75) Inventors: Steven T. Mayer, Lake Oswego, OR (US); John S. Drewery, Santa Clara, CA (US)

(73) Assignee: Novellus Systems, Inc., San Jose, CA (US)

(*) Notice: Subject to any disclaimer, the term of this patent is extended or adjusted under 35 U.S.C. 154(b) by 521 days.

(21) Appl. No.: 11/065,708

(22) Filed: Feb. 23, 2005

Related U.S. Application Data

(63) Continuation-in-part of application No. 10/739,822, filed on Dec. 17, 2003, now Pat. No. 7,449,098, which is a continuation-in-part of application No. 09/967,075, filed on Sep. 28, 2001, now Pat. No. 6,709,565, which is a continuation-in-part of application No. 09/412,837, filed on Oct. 5, 1999, now Pat. No. 6,315,883.

(60) Provisional application No. 60/105,700, filed on Oct. 26, 1998.

(51) Int. Cl.
*C25F 3/16* (2006.01)

(52) U.S. Cl. ...................... 205/674; 205/640

(58) Field of Classification Search ............... 205/224, 205/640, 674
See application file for complete search history.

(56) References Cited

U.S. PATENT DOCUMENTS

| | | | |
|---|---|---|---|
| 3,183,176 A | 5/1965 | Schwartz | 205/117 |
| 3,313,715 A | 4/1967 | Schwartz | 205/117 |
| 3,393,134 A | 7/1968 | Schwartz | 427/97.1 |
| 3,619,384 A | 11/1971 | Eisner | 438/400 |
| 3,661,752 A | 5/1972 | Capper et al. | 438/631 |
| 3,749,652 A | 7/1973 | Eisner | 205/93 |
| 3,751,343 A | 8/1973 | Macula et al. | 438/400 |
| 3,849,270 A | 11/1974 | Takagi et al. | 438/400 |
| 3,904,489 A | 9/1975 | Johnson | 438/697 |
| 4,119,499 A | 10/1978 | Eidschun, Jr. | 205/50 |

(Continued)

OTHER PUBLICATIONS

Osterwald et al., "New Theoretical Ideas about the Action of Bath Additives During Cathodic Deposition," Galvanotechnik, vol. 66 (1975). No. 5, pp. 360-365.

(Continued)

*Primary Examiner*—Harry D. Wilkins, III
*Assistant Examiner*—Nicholas A. Smith
(74) *Attorney, Agent, or Firm*—Weaver Austin Villeneuve & Sampson LLP

(57) ABSTRACT

The present invention pertains to apparatus and methods for planarization of metal surfaces having both recessed and raised features, over a large range of feature sizes. The invention accomplishes this by increasing the fluid agitation in raised regions with respect to recessed regions. That is, the agitation of the electropolishing bath fluid is agitated or exchanged as a function of elevation on the metal film profile. The higher the elevation, the greater the movement or exchange rate of bath fluid. In preferred methods of the invention, this agitation is achieved through the use of a microporous electropolishing pad that moves over (either near or in contact with) the surface of the wafer during the electropolishing process. Thus, methods of the invention are electropolishing methods, which in some cases include mechanical polishing elements.

17 Claims, 10 Drawing Sheets

U.S. PATENT DOCUMENTS

| | | | |
|---|---|---|---|
| 4,227,986 A | 10/1980 | Loqvist et al. | 205/117 |
| 4,363,711 A * | 12/1982 | Kuehnle | 204/192.26 |
| 4,452,684 A | 6/1984 | Palnik | 205/102 |
| 4,592,808 A | 6/1986 | Doubt | 205/102 |
| 4,738,756 A | 4/1988 | Mseitif | 205/50 |
| 5,034,753 A | 7/1991 | Weber | 343/846 |
| 5,096,550 A | 3/1992 | Mayer et al. | 205/642 |
| 5,158,860 A | 10/1992 | Gulla et al. | |
| 5,169,514 A | 12/1992 | Hendriks et al. | 205/247 |
| 5,203,955 A | 4/1993 | Viehbeck et al. | 2/209 |
| 5,256,565 A | 10/1993 | Bernhardt et al. | 438/631 |
| 5,277,785 A | 1/1994 | Van Anglen | 205/117 |
| 5,378,346 A | 1/1995 | Ashiru et al. | 205/244 |
| 5,453,174 A | 9/1995 | Van Anglen et al. | 205/117 |
| 5,462,649 A | 10/1995 | Keeney et al. | 205/93 |
| 5,486,234 A | 1/1996 | Contolini et al. | 216/91 |
| 5,557,027 A | 9/1996 | Kemp | 585/527 |
| 5,807,165 A * | 9/1998 | Uzoh et al. | 451/41 |
| 5,843,296 A | 12/1998 | Greenspan | 205/68 |
| 6,056,864 A | 5/2000 | Cheung | 205/222 |
| 6,056,869 A | 5/2000 | Uzoh | 205/771 |
| 6,083,835 A | 7/2000 | Shue et al. | 438/687 |
| 6,103,628 A | 8/2000 | Talieh | 451/63 |
| 6,121,152 A | 9/2000 | Adams et al. | 438/697 |
| 6,143,155 A | 11/2000 | Adams et al. | 205/87 |
| 6,152,586 A | 11/2000 | Dealey, Jr. et al. | 362/485 |
| 6,153,521 A | 11/2000 | Cheung et al. | 438/687 |
| 6,171,467 B1 | 1/2001 | Weihs et al. | 205/93 |
| 6,176,992 B1 | 1/2001 | Talieh | 205/87 |
| 6,207,572 B1 | 3/2001 | Talieh et al. | 438/692 |
| 6,251,235 B1 | 6/2001 | Talieh et al. | 204/220 |
| 6,315,883 B1 | 11/2001 | Mayer et al. | 205/123 |
| 6,328,872 B1 | 12/2001 | Talieh et al. | 205/206 |
| 6,344,129 B1 | 2/2002 | Rodbell et al. | 205/291 |
| 6,409,904 B1 | 6/2002 | Uzoh et al. | |
| 6,413,338 B1 | 7/2002 | DiPalma | 156/73.1 |
| 6,447,668 B1 | 9/2002 | Wang | 205/645 |
| 6,478,936 B1 | 11/2002 | Volodarsky et al. | 204/286.1 |
| 6,482,307 B2 | 11/2002 | Ashjaee et al. | 205/103 |
| 6,534,116 B2 | 3/2003 | Basol | 438/667 |
| 6,592,742 B2 * | 7/2003 | Sun et al. | 205/651 |
| 6,630,059 B1 | 10/2003 | Uzoh et al. | |
| 6,638,411 B1 | 10/2003 | Mishima et al. | |
| 6,653,226 B1 | 11/2003 | Reid | 438/631 |
| 6,709,565 B2 | 3/2004 | Mayer et al. | 205/640 |
| 6,756,307 B1 | 6/2004 | Kelly et al. | 438/691 |
| 6,793,796 B2 | 9/2004 | Reid et al. | |
| 6,797,132 B2 | 9/2004 | Talieh et al. | 204/212 |
| 6,815,354 B2 | 11/2004 | Uzoh et al. | 438/692 |
| 6,858,121 B2 | 2/2005 | Basol | 205/118 |
| 6,863,795 B2 | 3/2005 | Teerlinck et al. | 205/210 |
| 6,867,136 B2 | 3/2005 | Basol et al. | 438/687 |
| 6,902,659 B2 | 6/2005 | Talieh | 205/117 |
| 6,921,551 B2 | 7/2005 | Basol | 427/97.1 |
| 6,946,066 B2 | 9/2005 | Basol et al. | |
| 7,129,165 B2 | 10/2006 | Basol et al. | |
| 7,189,647 B2 | 3/2007 | Patton et al. | 205/210 |
| 2001/0013472 A1 | 8/2001 | Nakamura et al. | |
| 2004/0226827 A1 | 11/2004 | Matsuda et al. | |

OTHER PUBLICATIONS

Eisner, S., "Electroplating Accompanied by Controlled Abrasion of the Plate," Oct. 1971, pp. 993-996.

Osterwald, Jorg, "Leveling and Roughening by Inhibitors and Catalyst," Institute for Metallurgy of the Technical University of Berlin, vol. 17, No. 5, 1976, pp. 89-94.

Contolini, et al., "Electrochemical Planarization for Multilevel Metallization", Lawrence Livermore National Laboratory, J. Electrochem Soc., vol. 141, No. 9, Sep. 1994, pp. 2502-2510.

Sato, et al., "Newly Developed Electro-Chemical Polishing Process of Copper as Replacement of CMP Suitable for Damascene Copper Inlaid in Fragile Low-k Dielectrics", Advanced Process R & D Laboratories, LSI Technology Development, Semiconductor Network Company, Sony Corporation, IEDM Meeting, Dec. 2-5, 2001, pp. 1-4.

Tsai, et al., "CMP-Free CMP-Less Approached for Multilevel Cu/low-k BEOL Integration", Taiwan Semiconductor Manufacturing Company, No. 9, IEDM Meeting, Dec. 2-5, 2001, pp. 1-4.

U.S. Office Action for U.S. Appl. No. 10/824,069, mailed Nov. 20, 2007.

Notification of ownership transfer of certain patents owned by NuTool, Inc., 2007.

U.S. Appl. No. 10/824,069, filed Apr. 13, 2004 [43 pages].

Notice of Allowance, mailed May 15, 2008 for U.S. Appl. No. 10/824,069 [6 pages].

Notice of Allowance mailed Jul. 10, 2008 for U.S. Appl. No. 10/739,822.

* cited by examiner

METHOD AND APPARATUS FOR UNIFORM ELECTROPOLISHING OF DAMASCENE IC STRUCTURES BY SELECTIVE AGITATION

CROSS-REFERENCE TO RELATED APPLICATIONS

This application is a continuation-in-part, claiming priority under 35 USC 120 from U.S. patent application Ser. No. 10/739,822, now U.S. Pat. No. 7,449,098 filed Dec. 17, 2003, which is in turn a continuation-in-part of U.S. patent application Ser. No. 09/967,075, filed Sep. 28, 2001 by Mayer et al., titled "Method And Apparatus For Uniform Electropolishing of Damascene IC Structures By Selective Agitation," now issued as U.S. Pat. No. 6,709,565, which is in turn a continuation-in-part of U.S. patent application Ser. No. 09/412,837 filed Oct. 5, 1999, by Mayer et al., and titled "Electroplanarization of Large and Small Damascene Features Using Diffusion Barriers and Electropolishing," now issued U.S. Pat. No. 6,315,883, which claims benefit under 35 USC §119(e) from provisional patent application 60/105,700 filed Oct. 26, 1998. Each of these prior patent documents is incorporated herein by reference for all purposes.

FIELD OF THE INVENTION

The present invention pertains to apparatus and methods for surface planarization of metal surfaces. More specifically, it relates to electropolishing, electroetching and chemical etching technology for planarizing metal surfaces having low aspect ratio recesses or trenches as well as raised regions (bumps).

BACKGROUND OF THE INVENTION

In the fabrication of integrated circuits, as the number of levels in an interconnect technology is increased, the stacking of additional layers on top of one another produces a more and more rugged topography. Without planarization, the microscopic canyons that result on the integrated circuit surface from stacking of device features create a topography that (1) would limit the resolution of photo-lithography and creation of dense feature patterns, and (2) would lead to defects in the integrated circuit that would make the circuit unusable.

One method of planarization used in the art is chemical mechanical polishing (CMP). CMP is a process that uses a mixture of abrasives and pads to polish the surface of the integrated circuit. Unfortunately, CMP polishing techniques are difficult to control; the end-point can be difficult to detect. They are also expensive. The high equipment cost, waste handling cost, and low throughput contribute to the overall expense of CMP. Also, with the introduction of low-k dielectrics into chip production, modification of traditional CMP processes will be required, as current methods result in cracking and delamination of most low-k materials, which have a very low compression strength, and are extremely fragile.

Another method of planarization involves electrolytic etching technique such as electropolishing or electroless etching. These techniques are low cost methods, relative to CMP. Lower capital cost, easier waste handling, and much higher processing rates make it a desirable alternative to CMP. Electropolishing is a method of polishing metal surfaces by applying an electric current through an electrolytic bath, and removing metal via electrolytic dissolution. The process may be viewed as the reverse of electroplating.

A problem arises during the electropolishing of surfaces in which a large number of low aspect ratio (larger width than depth) features exist. Wide interconnect lines (trenches cut in a dielectric layer for a damascene process) and contact/bond pads often have low aspect ratios. Low aspect ratio features generally require the plating of an overburden layer slightly thicker than the thickness of the Damascene layer so that the feature will be completely filled after planarization. The metal fill profile above these features exhibits large recesses having profiles which resemble the original (low aspect ratio) feature. The metallization processes used to deposit the metal, which are substantially conformal over such low aspect ratio features, are typically not continued to a point which would geometrically "close" such recesses, because to do so would require depositing a very thick metal layer. To do so would be uneconomical due to necessary removal of the large excess of metal at a later stage. Conventional electropolishing techniques can planarize a surface in which the recessed feature to be planarized is no more than perhaps three times as wide as it is deep. For features wider than these, the rate of removal is essentially uniform everywhere. When the metal layer is electropolished to the dielectric surface, recesses over low aspect ratio features are propagated and expanded to produce recesses that span the width of these features leaving effectively little or no metal in the pad regions. Obviously, this is an unacceptable result.

The current state of electropolishing technology has additional difficulties. For example, electropolishing typically requires highly viscous electrolyte baths (e.g., 85% phosphoric acid ($H_3PO_4$) in water, or with some added ethylene glycol). While these baths are effective in achieving good polishing and planarization rates, they make it difficult to remove defect-causing bubbles and to handle the fluids in general. Note that, depending on the electrolyte and tool design, a hydrogen generating reaction may take place at the cathode. The hydrogen can become entrained in the electrolyte, complicating tool design and presenting a potential safety hazard. In addition, these baths also have high resistivities, making for large power requirements and substantial amounts of generated heat (which must be removed to maintain a constant process control).

Mayer et. al. (U.S. patent application Ser. No. 09/412,837, filed Oct. 5, 1999) describe a method of planarization of metal surfaces on wafers having both large and small recessed features by applying a film to the wafer surface prior to electropolishing. This film is applied in such a way that the film is thicker in the large feature recessed regions, and thinner over the substantially flat regions, and thinnest on exposed regions. This method allows differential electropolishing rates on different areas of the wafer such that planarization is achieved. While this technique is more effective with respect to conventional electropolishing approaches, the added application step can add cost to the operation, and may not sufficiently address planarization of raised regions (bumps) on the metal surface.

As mentioned, electroplating is a process that generally yields conformal deposition over low aspect ratio features and for the reasons described above, electroplating typically leaves large recessed areas over these type features. Additionally, it can be shown for conventional copper plating baths (i.e. not "superfilling" baths) both theoretically and experimentally that high aspect ratio features (i.e. depth to width >3:1) are rapidly filled, and the metal above them becomes rapidly planarized. Using the electroplating methods mentioned above, small recessed areas exist in the metal fill profile over high aspect ratio features.

More commonly today however, electroplating bath additives are utilized to aid in the rapid "bottom-up" filling of higher aspect ratio features (e.g. in Damascene copper electroplating processes) to ensure homogeneous metal fill of these narrow features. Baths with "bottom-up" filling characteristics planarize smaller features much more rapidly than baths without such additives. In some cases (e.g. plating baths with superior bottom-up filling characteristic and no leveling additives) plating occurs at an accelerated rate after completing the small feature filling stage (see for example, "A Superfilling Model that Predicts Bump Formation", A. C. West, S. Mayer, and J. Reid, Electrochemical and Solid State Letters, Vol. 4, No. 7, July 2001 and "Integration of Copper PVD and Electroplating Process for Damascene Feature Electrofilling, S. Mayer et. al., *Interconnects and Contact Metalization for ULSI*, Proceeding of the International Symposium, Electrochemical Society Inc., Volume 99-31, and "Factors Influencing Damascene Feature Fill Using Copper PVD and Electroplating", Solid State Technology, July, 2000, pg 86-103). When many high aspect ratio features are located in close proximity, a macroscopic raised area (series of bumps or a raised plateau) can be formed. This bump formation is also termed, "feature overplating."

Thus, use of advanced "bottom up" electrofill paradigms in combination with wafers having many low and high aspect features have created a problem of deposited metal surfaces having a range of topography to be planarized that is unusually large, i.e. containing both recessed and raised areas. Commonly, features that vary in size by two orders of magnitude on a single layer exist. A 1 µm deep feature can have widths of from 0.2 µm to 100 µm. Therefore, while electroplating is a preferred method of metalization, various aspects of improved plating regimens create challenging topography for subsequent planarization.

What is needed therefore is improved electropolishing, electroetching and chemical etching technology for planarizing conductive layers having varying topography, particularly conductive layers having both recesses and raised regions having both very small (submicron) and very large (on the order of 100 micron) widths.

SUMMARY OF THE INVENTION

The present invention pertains to apparatus and methods for planarization of metal surfaces having both recessed and raised features, over a large range of feature sizes. The invention accomplishes this by increasing the fluid agitation in raised regions with respect to recessed regions. That is, the agitation of the electropolishing bath fluid is agitated or exchanged as a function of elevation on the metal film profile. The higher the elevation, the greater the movement or exchange rate of bath fluid. In preferred methods of the invention, this agitation is achieved through the use of a microporous electropolishing pad that moves over (either near or in contact with) the surface of the wafer during the electropolishing process.

Movement of the pad over the wafer surface can be combined with processes in which one "masks" certain regions of a wafer surface with either "diffusion barriers." or "kinetic barriers". Preferably, these barriers are selectively ablated by mechanical removal into the electropolishing pad.

Preferably, the diffusion barrier, acting as a mass transport "mask", is formed or placed on the wafer surface (by various means) prior to electropolishing and consists of a material of relatively low ionic conductivity and diffusivity. This effectively slows or blocks transport of metal ions produced during electroetching, electropolishing, or chemical etching. The diffusion barrier layer can be composed of various material types, but is generally of a substantially higher viscosity, by at least an order of magnitude, than the electropolishing, electroetching, or chemical etching electrolyte. In some cases the diffusion barrier is soluble in the electrolyte and in other cases the diffusion barrier is not soluble in the electrolyte. For each of these scenarios, a particular electropolishing pad is preferred.

For methods of the invention using electrolyte-soluble diffusion barriers, the electropolishing pad is preferably (but not necessarily) non-abrasive. For example a diffusion barrier film which is applied to the wafer is made of an electrolyte-soluble viscous liquid, and this is used in conjunction with a non-abrasive electropolishing pad.

For methods of the invention using electrolyte-insoluble diffusion barriers, the electropolishing pad is preferably (but not necessarily) abrasive. For example a diffusion barrier film which is applied to the wafer is made of an electrolyte-insoluble solid, and this is used in conjunction with a pad of sufficient abrasive properties to remove the insoluble film from the wafer's exposed regions. In one embodiment, the pad should be sufficiently abrasive to break up the barrier film into small particles that can be removed from the surface region in the flowing electrolyte. In another embodiment, the abrasive electropolishing pad simply loads the removed diffusion barrier material internally in its pores. Alternatively, film material stored in the pore structure of the abrasive pad is periodically flushed out using a high fluid flow rate or a chemical that is a solvent for the insoluble film.

Electropolishing pads of the invention will be chemically compatible with the electrolyte (i.e. will not dissolve or otherwise break down). The pad will have a small pore size and be sufficiently porous to allow fluid and electrical current to easily flow through. A long-lived pad is also desirable, i.e. one that wears slowly.

In some methods, a diffusion barrier material is not added to the surface prior to electropolishing. In these methods the mechanical ability of the pad to thin or remove continually forming anodic surface films from exposed areas leads to an increased current density in those regions. The anodic films are preferentially dissolved away or mechanically removed from the wafer surface, via enhanced agitation of the electrolyte and/or the abrasive structure provided by the electropolishing pad. By selectively removing this film in the exposed regions, substantial differences in current density (and hence removal rate selectivity) is accomplished.

Thus, one aspect of this invention provides a method of electroplanarizing a metal layer disposed on a wafer surface, said metal layer having both recessed and raised regions on the field. Such methods may be characterized by the following sequence: (a) immersing the wafer holder into an electrolyte solution containing an electropolishing pad; (b) creating relative movement between the metal layer and the electropolishing pad; (c) bringing the wafer work surface and the electropolishing pad into proximity or contact with each other; (d) passing an anodic electrical current from the wafer through the electrolyte solution and to a cathode; and (e) stopping the passage of current at a point where all or a majority of the metal layer is removed from the field.

In a preferred embodiment we add the additional steps of selectively applying a diffusion barrier film to the recesses prior to performing electropolishing with the pad (prior to step (a) above). This process is particularly useful when the properties of the pad and polishing electrolyte are selected to remove diffusion layer material from the recesses more slowly than from the field regions. Any suitable process may be used to apply the diffusion barrier film. Preferably, the diffusion barrier film is applied in a manner that gives it a substantially planar surface. The degree of planarity of the diffusion barrier aids in the uniformity of the subsequent polishing process.

In cases where a solid or a very high viscosity non-ionically conducting diffusion barrier is added to the surface prior to electropolishing, one can remove the barrier from the field areas of the wafer selectively (for example by polishing with an abrasive pad) in a separate apparatus and thereby leave the barrier only in the recessed regions.

Another aspect of the invention is a method of electrochemically planarizing a metal layer deposited on a wafer. Such methods may be characterized by the following sequence: (a) applying a diffusion barrier film to a metal layer on the surface of a wafer; (b) removing the diffusion barrier film to expose only areas of highest elevation of the metal layer; and (c) electrochemically removing metal from the exposed regions of the metal layer until a newly defined field region is reached. Preferably (b) and (c) are repeated iteratively until a predetermined degree of planarization of the metal layer is achieved. Preferably (b) is achieved via mechanical removal with a polishing pad or via dissolving the uppermost portion of the diffusion barrier with a solvent.

Yet another aspect of the invention is an electropolishing apparatus for removing a portion of a metal layer disposed on a wafer. Such an apparatus may be characterized by the following elements: (a) a wafer holder for holding the wafer such that the metal layer is exposed; (b) a movement assembly configured to create relative movement between the metal layer and an electropolishing pad as well as positioning the metal layer's work surface and the electropolishing pad's work surface in proximity or contact with each other; and (c) an electropolishing cell containing the electropolishing pad and a cathode, both immersed in an electrolyte. Preferably during electropolishing, electrical current passes between the metal layer and the cathode through at least that portion of the electrolyte contained in a plurality of pores in the electropolishing pad. Also preferably, the wafer holder is configured to supply an anodic electrical current to the metal layer.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. For example, the invention is described in terms of methods and apparatus in relation to electroplanarization of a metal layer for semiconductor wafer processing. The invention is not limited to semiconductor wafer processing, that is, the invention can be used to planarize metal surfaces on other substrates as well. In some descriptions herein, well-known processes, procedures, and components have not been described in detail so as not to unnecessarily obscure aspects of the present invention.

The invention is primarily described in terms of electropolishing; however, it is critical to understand that the methods and apparatus described herein can also be used for electrochemical etching in general. Therefore, a reference to polishing may also be interpreted as etching or removal, but is generally referred to as "chemical polishing," vs. "electropolishing," due to the fact that no electrical current is applied during the process. Of particular note is the equivalence of electrolytic electropolishing with electroless (chemical) electropolishing and etching techniques. It is understood by those skilled in the art that electroless processes can be accomplished by use of chemical oxidizers in place of electrochemical anodic current to accomplish the same means. Examples of suitable chemical oxidizers for metal electroless electropolishing include but are not limited to hydrogen peroxide, persulfates, permanganates, and dissolved gasses such as bromine, chlorine, iodine, ozone, and oxygen.

This invention enables electroplanarization by electropolishing such that the topography created by metal filling both large (e.g., >5 μm wide, low aspect ratio) and small (e.g., <5 μm wide, high aspect ratio) features is effectively planarized. In the context of copper Damascene processing, a substantially flat substrate is produced in which embedded metal remains in a dielectric/insulating media.

Figure 1A:
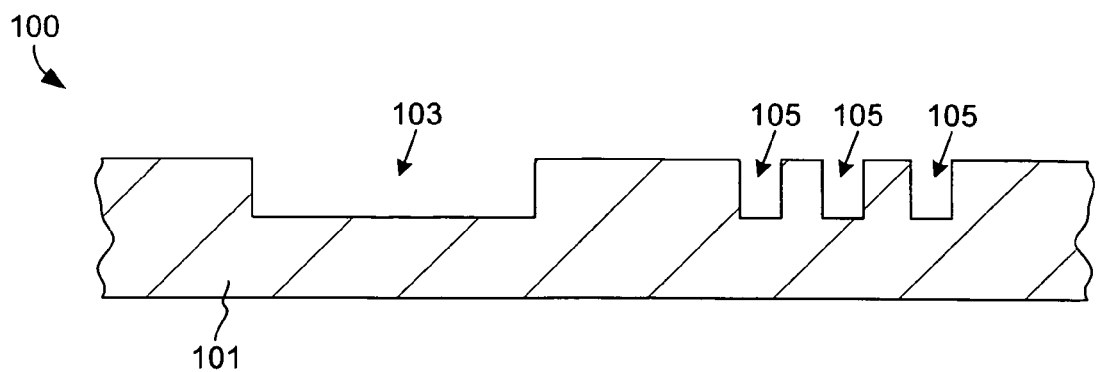
FIGS. 1A-C depict representative wafer substrates in accordance with aspects of the invention.

An initial operation in a Damascene process involves the manufacture of recessed trenches, via holes, pad structures, or the like into the dielectric substrate. FIG. 1A depicts a cross sectional portion 100, of a dielectric substrate 101 (for example an $SiO_2$ layer on a wafer), having low aspect ratio feature 103, and high aspect ratio features 105 etched in its surface.

Before a metal layer (intended to fill features 103 and 105) is deposited on patterned dielectric 101, typically a diffusion barrier (to prevent diffusion of metal ions into the dielectric), an adhesion barrier (to aid in adhesion of subsequently deposited metal), and a metal seed layer (to provide a conductive layer for electroplating processes) may be applied. For simplicity, these films are not depicted in these figures, but it understood in the art that deposition of these films are conventional aspects of Damascene processing.

Preferably, the metal layer will be comprised of copper or an alloy of copper. Note that metals are typically employed as interconnects and contact pads in integrated circuits. Copper is a particularly preferred metal for use in Damascene-type processes to form interconnects and contact pads. Other metals that may be suitable for use for this invention include aluminum, silver and gold. In some cases, the layer may be formed from a non-metal conductive material, so long as that conductive material is susceptible to planarization via electropolishing, electroetching, or chemical etching.

Figure 1B:
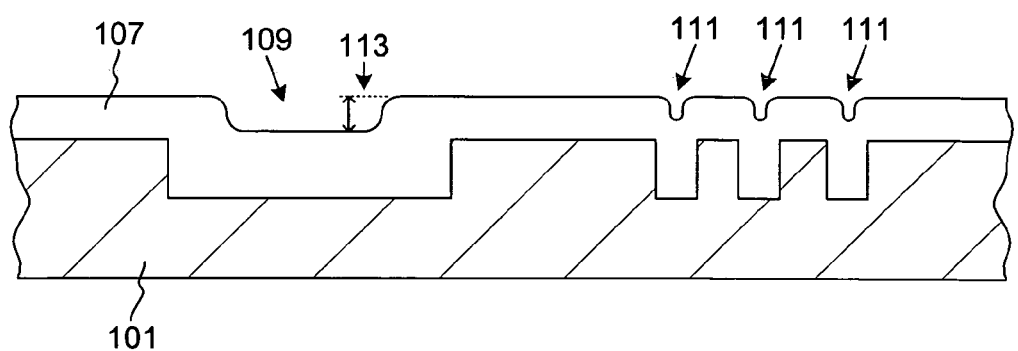

As depicted in FIG. 1B, when the openings in dielectric 101 are filled with a metal 107 (preferably copper) by a process such as electroplating, a minimum amount of metal must be added to the part in order to completely fill the feature. As mentioned, electroplating generally yields conformal deposition that typically leaves large recessed areas 109 over low aspect ratio features, and small recessed areas ("nips") 111 over high aspect ratio features (when conventional baths are used). In this case, the range of topography to be planarized spans only the depth of the features 109 and 111. See 113.

More commonly however, electroplating bath additives (containing "superfilling" components) are utilized to aid in the rapid "bottom-up" filling of higher aspect ratio features to ensure homogeneous metal fill of these narrow features. In this case, plating occurs at an accelerated rate after completing the small feature filling stage. When many high aspect ratio features are located in close proximity (e.g. features 105 in FIG. 1A), a macroscopic raised area (bump) can be formed.

Figure 1C:
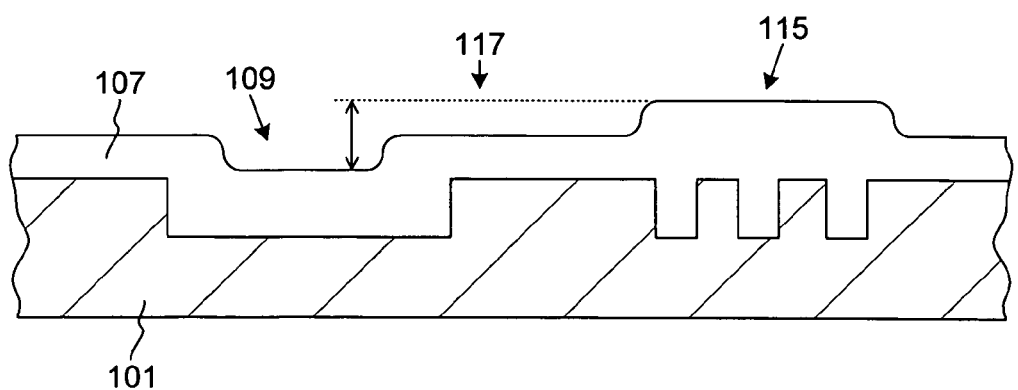

FIG. 1C depicts the result of such metal deposition on dielectric 101. While low aspect ratio features are filled as before, forming recessed area 109; over clusters of high aspect ratio features, overplating occurs, which forms a bump or plateau 115. The plateau is believed to form by combination of a series of smaller bumps, each forming over an individual feature, that later merge. In this case, the range of topography to be planarized spans not only the depth of recess 109, but also the height of bump 115. See 117.

The invention is particulary useful for planarizing metal layers having a range of topography that is unusually large, i.e. containing both recessed and raised areas. Commonly, features that vary in size by two orders of magnitude on a single layer exist. A 1 μm deep feature can have widths of from 0.2 μm to 100 μm.

As mentioned, one aspect of the invention is a method of electroplanarizing a metal layer disposed on a wafer work surface, the metal layer having a plurality of recessed regions and a plurality of raised regions on the field. Such methods may be characterized by the following sequence: (a) immersing the wafer holder into an electrolyte solution containing an electropolishing pad; (b) creating relative movement between the metal layer and the electropolishing pad; (c) bringing the wafer work surface and the electropolishing pad into proximity or contact with each other; (d) passing an anodic electrical current from the wafer through the electrolyte solution and to a cathode; and (e) stopping the passage of current at a point where all or a majority of the metal layer is removed from the field. Preferably, the electropolishing pad is also immersed in the electrolyte solution and electrical current passes through at least said electrolyte solution contained in a plurality of pores in the electropolishing pad during electropolishing.

As mentioned, methods of the invention take advantage of increased local fluid agitation at or near the surface of the electropolishing pad, caused by the movement of the pad in the electrolyte near or in contact with the metal layer. Specifically, raised regions are exposed to the electrolyte undergoing increased agitation, relative to recessed regions on the metal film profile. Put another way, the rate of exchange of electrolyte to which the features on the metal layer are exposed varies with elevation. The higher the elevation of the feature, the greater the exposure to electrolyte with higher agitation levels. In some methods, applying a diffusion barrier to the metal layer prior to the electropolishing process enhances the differential exposure to the agitated electrolyte. The pad does not have to contact any portion of, or the entire wafer surface of, the wafer at one time. Varying degrees of proximity between the moving pad within the diffusion barrier and the wafer surface leads to preferential selective removal. Therefore, to be effective the average extremity of electropolishing pad of the invention and the wafer work surface (local area) with enhanced diffusion (because of the pad presence) are between about 0 and 2 μm apart.

In methods where the electropolishing pad actually contacts the wafer, a mechanical removal element is added to the electropolishing methods of the invention. When the pad agitates and mechanically rubs the exposed regions of the surface, substantial differences in electropolishing rates between the lower elevation and higher elevation regions of the metal layer are achieved. This is unlike classical electropolishing in an electropolishing bath, where the controlling polishing film is generated from an initially homogeneous solution with concentration gradients generated during the process. When a pad is not used, the film follows the global contours of the surface (i.e. contours which are wider than high), but becomes substantially thicker and penetrates into features that are of high aspect ratios. When a pad is used to disturb this film in the elevated regions of the surface, the film is preferentially thinned there and the rate of dissolution become substantially different in the field than inside the large recessed feature.

Preferably, this agitation is achieved through the use of a microporous electropolishing pad that moves over (near or in contact with) the surface of the wafer during the electropolishing process. Preferably, the pad actually is in contact with the metal layer during electropolishing. In this case, there is also a mechanical component to the polishing process, although the pad need not be abrasive, nor does the solution need to contain abrasive particles, as in CMP. Such methods may be envisioned as a hybrid electromechanical polishing processes, i.e. although having a mechanical element, primarily they are electropolishing methods.

A non-abrasive electropolishing pad of the invention will be chemically compatible with the electrolyte (i.e. will not dissolve or otherwise break down). The pad will have a small pore size and be sufficiently porous to allow fluid and electrical current to easily flow through. The pad preferably will have a hardness substantially less than the metal surface being polished, so as not to scratch the wafer. A long-lived pad is also desirable, i.e. one that wears slowly.

An abrasive electropolishing pad of the invention should be sufficiently abrasive to break up the barrier film into small particles that can be removed from the surface region in the flowing electrolyte. In another embodiment, the abrasive electropolishing pad simply loads the removed diffusion barrier material internally in its pores. In this case, the capacity of the pad should be enough that frequent change out is not required. Alternatively, film material stored in the pore structure of the abrasive pad is periodically flushed out using a fluid push. The abrasive electropolishing pad will also be chemically compatible with the electrolyte (i.e. will not dissolve or otherwise break down). The pad will have a small pore size and be sufficiently porous to allow fluid and electrical current to easily flow through. A long-lived pad is also desirable in this case, i.e. one that wears slowly.

Preferably an electropolishing pad of the invention have a small pore size, preferably each pore having a mean diameter of between about 0.02 μm and 10 μm. The pad should be sufficiently porous to allow electrical current and electrolyte to flow through the pad easily, preferably a void fraction of between about 20 and 80%.

One skilled in the art would understand that the porous structure of the pad may take many forms. For example, the pores may be generally spherical in shape as in a pad where the pores are formed as a result of gas bubbles trapped in (or forced into) a polymerized material used to make the pad. Alternatively, the pad may comprise a bundle of rods, and the pores comprise the voids created between the bundled rods. There are other embodiments of the pad structure not described herein that are within the scope of the invention.

Relative movement between the pad and wafer can be achieved by moving the pad, the wafer, or both. Preferably the movement is rotation about an axis perpendicular to the work surfaces of the pad and wafer. In one preferred embodiment, the pad is stationary, being attached to a mechanical support in an electropolishing apparatus.

In a particularly preferred method and apparatus, fresh polishing electrolyte is forced through the polishing pad and it impinges on the metal layer on the wafer work surface. If the resistance to fluid flow through the pad is substantially large enough, the flow will be uniform throughout the pad and a uniform laminar flow will impinge the wafer surface.

Also as mentioned, movement of the pad over the wafer surface can be combined with processes in which one "masks" certain regions of a wafer surface with "diffusion barriers." Preferably (but not necessarily), these barriers are selectively ablated by mechanical removal into the electropolishing pad. Also preferably the diffusion barrier, acting as a mass transport "mask", is formed or placed on the wafer surface (by various means) prior to electropolishing and consists of a material of relatively low ionic conductivity and diffusivity. This effectively slows or blocks transport of metal ions produced during electroetching or electropolishing.

The diffusion properties of the diffusion barrier film are important to its functioning. Preferably, it has a diffusion coefficient for ions of the material to be removed that is lower than the diffusion coefficient for such ions in the primary electropolishing bath electrolyte. In specific embodiments, the diffusion barrier film has a diffusion coefficient for the metal ions that varies inversely (and often non-linearly) with the concentration of the ions in the diffusion barrier film (e.g. copper). This is usually a result of a higher degree of metal ion complexation with the solvent molecules (mainly metal ion paring with the limited amounts of water), an increase in ionic radius and electrolyte viscosity, and hence a local lowering of the electrolyte conductivity and the metal ion diffusion coefficient. In some cases (depending on the electrolyte) the copper ions may precipitate out or form an oxide, hydroxide or salt, and hence form a diffusion and electrically resistive film. This film can then be preferentially removed from the exposed area of the surface by the action of the pad yielding the desired differential removal rates.

In some preferred methods of the invention, an insoluble non-ionically conductive film (e.g. a polymer) is applied prior to electropolishing. Then, the pad mechanically removes the film on the exposed regions (aspirates). In this way the passage of current is activated in the areas in which polishing is desired, and remains inactive in the regions coated with the diffusion barrier. After removing the barrier, there is no particular need to keep the pad in contact with the pad, and electropolishing can occur in a more conventional manner. Periodically, the pad can be made to come in contact with the wafer aiding in the removal of the diffusion barrier film to expose surfaces of the features of highest elevation.

In certain embodiments, the diffusion coefficient of the film may be so small that the film effectively blocks all the diffusion of relevant species to and from the underlying conductive material layer. Therefore, the distinction between completely insulating films and those that are largely insulating but has slight conducting properties is not absolute. The important point is that there is a substantial difference between the rate of diffusion of metal ions generated at the surface through the film vs. the bulk electropolishing electrolyte.

In particularly preferred embodiments, the film diffusion coefficient for the relevant species varies inversely with the concentration of the species in the diffusion barrier film (an example of this behavior is copper ion in concentrated phosphoric acid). For example, the film may have a relatively high diffusion coefficient for copper ions when the concentration of such ions in the film is very low. However, as the concentration of copper ions increases within the film, the diffusion coefficient for such ions decreases, thereby slowing diffusion of copper ions through the film. In one such embodiment, the relation between diffusion coefficient and species concentration varies non-linearly. For example, if the concentration of copper ions in the film increases by a set amount, the diffusion coefficient may decrease by more than a proportionate amount based upon the increase in copper ion concentration.

The diffusion barrier layer can be composed of various materials, liquid or solid, but is generally of a substantially higher viscosity, by at least an order of magnitude, than the electropolishing electrolyte. In some cases the diffusion barrier is soluble in the electrolyte and in other cases the diffusion barrier is not soluble in the electrolyte; for each of these scenarios, a particular electropolishing pad is preferred.

For methods using electrolyte-soluble diffusion barriers, the electropolishing pad is preferably (but not necessarily) non-abrasive. For example a diffusion barrier film which is applied to the wafer is made of an electrolyte-soluble ionic conducting viscous liquid, and this is used in conjunction with a non-abrasive electropolishing pad.

As mentioned, viscous liquid diffusion barrier films of the invention can be soluble in an electropolishing bath electrolyte. Examples of such suitable viscous liquids include concentrated phosphoric acid, concentrated sulfuric acid, boric acid, glacial acetic acid, ethylene glycol, propylene glycol, poly-oxy-ethylene glycols (of molecular weights varying from 100 to 20,000), poly-oxy-propylene glycols (of molecular weights varying from 100 to 20,000), and mixtures thereof. In one specific embodiment, the diffusion barrier film is phosphoric acid having a concentration of at least about 40% by weight (more preferably between about 70 and 100% by weight). In the case of concentrated acid films, other components may be employed to control the film viscosity, conductivity, etc. These components may include, for example, water, propylene carbonate, ethylene carbonate, and sulfuric acid.

Typically, the film and/or the electropolishing bath will also include a salt of the material to be removed. For example, if the material to be removed is copper, the phosphoric acid film should have some salts of copper, including but not limited to copper sulfate ($CuSO_4$), copper phosphate ($Cu_3(PO_4)_2$), cupric monohydrogen phosphate ($CuHPO_4$), copper monohydroxy phosphate ($Cu_2(OH)PO_4$), and copper nitrate ($Cu(NO_3)_2$). Alternatively, $Cu_2O$, $CuO$, or $Cu(OH)_2$ can be added to react with the acids to form water and the metal salt of the acid. Such salts are added to allow immediate plating of the polished metal on the counter electrode (a cathode) during electropolishing and thereby avoid generation of bubbles (mainly hydrogen) from the electrolysis of the electrolyte at the counter electrode. Such bubbles can very negatively impact the quality of electropolished film at the substrate (and potentially create a safety hazard). In a specific example, the concentration of copper salts in the film is at least about 0.1 mole/liter, more preferably at least about 0.25 mole/liter, and most preferably at least about 0.5 mole/liter (up to the solubility limit of the metal ion in the solvent).

Another component that may be added to the viscous liquid film may be a surface agent such as a wetting agent, a brightening agent, or an agent that effectively increases the kinetic overpotential to provide more uniform electropolishing over the substrate surface or deposition on the counter electrode, respectively. Examples of wetting agents include sodium lauryl sulfate (e.g., between about 0-2% by weight), and various co-polymers of poly-oxy-ethylene glycol (PEG) and poly-oxy-propylene glycol (PPG). Examples of brightening agents include coumarin, benzotriazole, MPS (mercaptopropane sulphonic acid) and SPS (di-mercaptopropane sulphonic acid). Examples of materials that promote more uniform plating include polyethylene glycol, polyethylene oxide, polypropylene oxide, polypropylene glycol, and copolymers of any of these. Small amounts (10 to 100 ppm) of chloride ion may be added to aid in the surface adsorption of these compounds. In addition, 0 to 1 mole/liter tetraethylammonium tetrafluoroborate or dodecyl trimethyl ammonium tetrafluoroborate (or other electrochemically-stable salts (oxidatively stable with respect to water)) may be used as a supporting electrolyte to reduce the overall potential drop of the electropolishing process, as well as to enhance the polishing performance.

In addition to methods and materials that create "diffusion" barriers that are selectively removed from the field areas by interaction with a moving pad, materials and methods which can selectively remove very thin films (e.g. a few monolayers, a monolayer, or submonolayers) of a chemical or electrochemical kinetically limiting surface material are also effective in creating the desired feature-height dependent anodic removal rate selectivity of the invention. We refer to this type of process as a "kinetic barrier removal" process. In the kinetic barrier removal process, the selectively in removal rates is achieved through the differences in charge transfer rate (or etching rates in the case of chemical etching) associated with a surface-controlled process in which the charge transfer rate is strongly influenced by a kinetic inhibitor. As with the diffusion barrier process, the inhibitor material can be added to the surface in a separate step and/or separate processing module prior to the removal of metal selectively from the wafer field or raised regions. For example, the wafer can have the kinetic barrier material removed from the generally planar (field) areas of the wafer. Then the wafer is exposed to the electrochemical polishing, electrochemical etching, or chemical etching processes to remove metal selectively from the exposed regions faster than areas where the kinetic barrier material remains.

The preferred method of selective removal is by selective mechanical/chemical removal of the material using a porous pad in contact with the general wafer surface. Further, the kinetic barrier material can be removed in the same apparatus as the metal removal apparatus. In a particularly preferred process method and particularly preferred materials, the kinetically inhibiting compound is exposed to, and thereby absorbed to the surface, from the electrolyte/etching solutions simultaneously with the metal removal operations. In this case, the material is continuously selectively removed, for example, from the exposed areas by the interaction of a porous pad moving over the wafer surface and rubbing the exposed regions selectively. The balance between the rate of uptake of kinetically inhibiting compound to the surface (controlled, for example, by diffusion to the surface and the rate of adsorption) and the rate of its removal (controlled, for example, by the rate of desorption, rate of incorporation into the pad material and the removal of a monolayer of metal, etc). leads to a uniquely different inhibition rate between area exposed to surface "mechanical stress and wear" compared to unexposed areas. Kinetically limiting materials are typically those materials that strongly absorb (both chemically and physically) to the metal of interest and interfere with the electrolyte/metal charge transfer processes. In the case of copper selective removal, sulfur and double-bonded nitrogen-containing compounds, such as those commonly used as corrosion inhibitors, have been found to be particularly effective. Of particular utility are compounds such as benzotriazole and its derivatives (most notably the derivatives substituted off the single-bonded nitrogen of the triazole moiety) are particularly effective in yielding large feature selectivity using the above-described methods.

In addition, the inclusion of "kinetically inhibiting" agents of the type that remain attached more to recessed copper regions vs. asperities, the latter of which are always in contact with the moving pad surface, significantly help in increasing the kinetic overpotential primarily of the recessed copper areas of the wafer. Kinetically inhibiting agents of the imadazole type such as 4-methylimidiazole, 1-phenyl-4-methyl imidazole, and 1-(p-tolyl)-4-methylimidiazole (as found in R. Gasparac, et. al., J. of the Electrochemical Society, V. 147, p. 991 (2000)) have a significant advantage in decreasing the etch rate of the recessed regions which are untouched by any pad.

For methods using electrolyte-insoluble diffusion barriers, the electropolishing pad is preferably (but not necessarily) abrasive. For example a diffusion barrier film which is applied to the wafer is made of an electrolyte-insoluble non-ionically conductive solid (e.g. polyvinylidene difluoride), and this is used in conjunction with an abrasive electropolishing pad.

A wide range of non-ionically conducting polymer types can be used as diffusion barrier films, though the method of their application and use depends on the polymer's properties. These diffusion barrier films should essentially block all diffusion of ions necessary for electropolishing. They should also be essentially insoluble in the bath electrolyte. When using an aqueous electropolishing bath electrolyte, examples of suitable diffusion barrier polymers include polyvinylidene difluoride, polyvinyl chloride, and ethylene propylene diene monomer. When using a non-aqueous electropolishing bath electrolyte such as propylene carbonate, ethylene carbonate, dimethyl carbonate, diethyl carbonate, or a mixture of these, examples of suitable diffusion barrier polymers include polyvinylidene difluoride (PVDF), and ethylene propylene diene monomer (EPDM) rubbers.

In specific embodiments, the polymer film is applied as a liquid (melted or dissolved in an appropriate solvent). It is then dried/cooled to leave an essentially planarized surface covered with polymer or other suitable film material (such as very highly concentrated phosphoric acid). The film may be applied as a dissolved solid, which is subsequently dried. A polymer melting process may follow to achieve planarization and/or adhesion of the film. Next, the electrically and ionically insulating barrier film (diffusion barrier film) can be removed from the regions of highest elevation in the conductive layer so that those areas are active in the electropolishing process (this can be accomplished as part of an electropolishing operation or prior to electropolishing). Selective removal from the regions of highest elevation can be accomplished by such methods as spraying the surface with a solvent while the part is spinning at a high rate, or mechanically removed by using an abrasive porous pad. The resultant structure has a diffusion barrier film in the low aspect ratio features (making them inactive or less active to the polishing process), but has exposed conductive material in the field regions, devoid of the insulating barrier film. The part can then be electropolished and its surface effectively planarized.

In a specific example, the diffusion barrier film is composed of concentrated anhydrous phosphoric acid (orthophosphoric acid) that is heated to above its melting point (41-44° C.) and applied as a liquid to a substrate with raised (exposed), flat, and recessed features. Preferably, the substrate is a wafer as described herein (and known in the art of semiconductor manufacture, most particularly Damascene processing). The liquid is applied to form a uniform thin film on the wafer. Methods of application include spraying, dipping, and using a set of rotating rollers. In a particularly preferred embodiment, heated phosphoric acid solution is applied by spraying onto a rotating substrate. Another process that could be employed is to use a polymer knife edge (e.g. a squeegee) or number of knife edges that presses against the wafer surface, only removing the liquid, or the cooled soft solid material, from the uppermost surfaces.

In another specific example, the film is applied as a liquid made from polyvinylidene difluoride (PVDF) dissolved in dimethylformamide (DMF) or 1-methyl-2-pyrrolidinone (NMP), and spray coated (or dipped or using a set of rotation rollers) onto the copper coated damascene structure and allowed to dry (solvent evaporation). Oxalic acid can be added to the mixture to improve adhesion of the polymer to the copper film by making the pH of the solution acidic and thereby improving the copper-fluorine physiochemical bonding. This can be followed by heating of the surface to the polymer's melting point (about 160° C.) by heating the wafer in hot air, or by infrared (IR) heat. The wafer is then processed by one of the methods described herein. Alternatively, EDPM rubber dissolved in a cyclohexane can be substituted for the PVDF in the above example.

Some methods of the invention are continuous electropolishing methods that continually remove metal and diffusion barrier from the work surface of a substrate until it is planarized. Other methods are iterative processes, where some steps are purely for removal of diffusion barrier film and other steps are purely for electropolishing a conductive layer. One skilled in the art would understand that combinations of such processes may be used without escaping the scope of the invention.

Figure 2A:
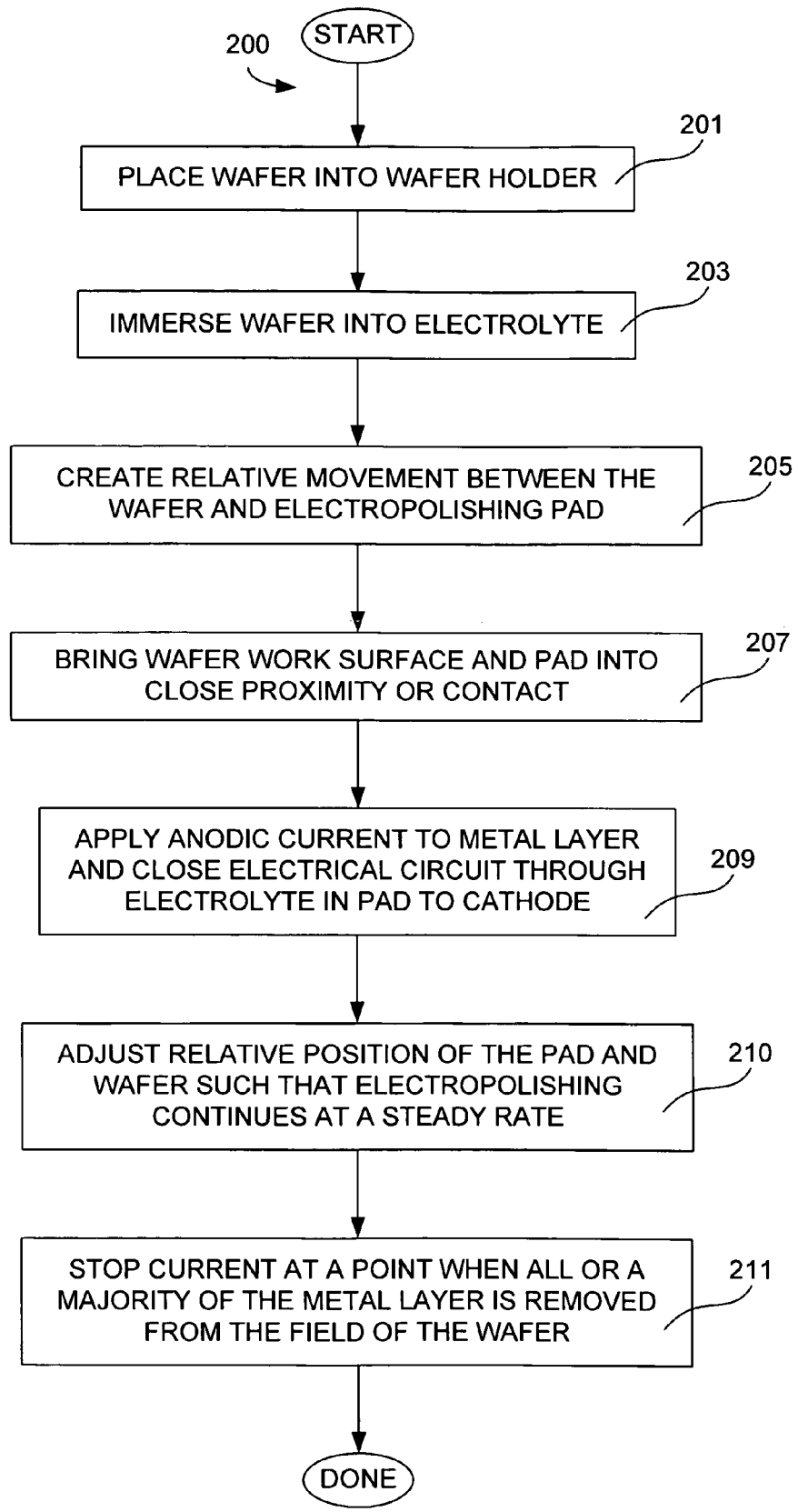
FIG. 2A is a flow chart describing a method in accordance with aspects of the invention.

In conjunction with FIGS. 2A-G, an example method of the invention will be described. FIG. 2A depicts a method, 200, of electroplanarizing a wafer having a metal layer deposited thereon in the context of a Damascene process. While this process flow is described in detail, methods of the invention do not require all of the described steps or the particular order of any sequence of steps.

Figure 2B:
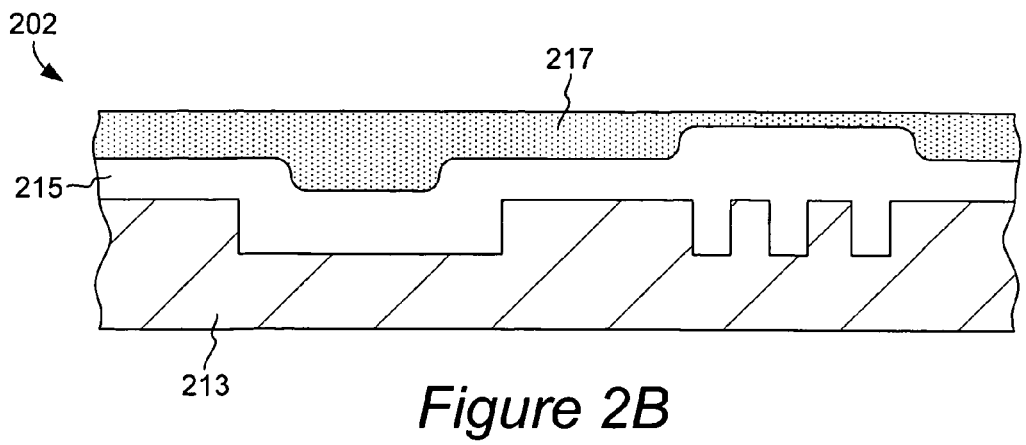
FIGS. 2B-G depict representative wafer substrates described in conjunction with the method in FIG. 2A.

As mentioned, typically a wafer substrate (as described in relation to FIG. 1C) is coated with a diffusion barrier film prior to methods of the invention. FIG. 2B depicts a substrate, 202, which is such a coated wafer. Dielectric 213 has deposited on its surface a metal (e.g. copper) layer 215, which displays a topological profile having both a large recess and a bump. A diffusion barrier film 217 has been applied to metal layer 215. As mentioned, film 217 can be a viscous liquid or a solid (preferably a polymer) applied as described above. Note that in the case of applying a solid diffusion barrier film (e.g. polymer) or very viscous diffusion barrier film (e.g. concentrated phosphoric acid), the film application may require that material be heated to ensure that it flows sufficiently well to cover the substrate surface. In this example, layer 217 is a polymer.

Referring again to FIG. 2A, wafer substrate 202 is placed into a wafer holder. See 201. The wafer is immersed into an electrolyte. See 203. Next, relative movement is created between the wafer substrate 202 and an electropolishing pad. See 205. Then the wafer and the electropolishing pad are brought into proximity or contact. See 207. In this case, the wafer and pad contact each other, and therefore the pad not only can electropolish metal layer 215 (once exposed) but also mechanically remove diffusion layer 217.

Figure 2C:
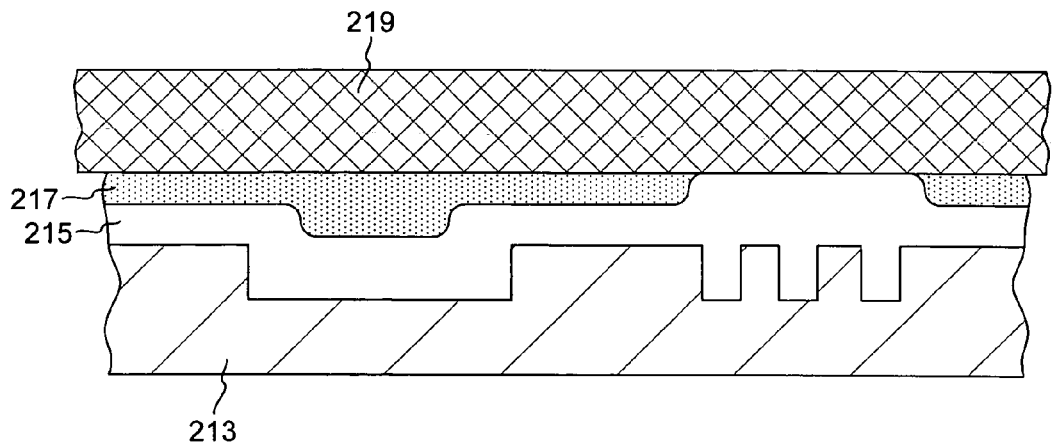

Referring to FIG. 2C, in this case electropolishing pad 219 is an abrasive pad. As depicted, pad 219 has ablated a portion of diffusion barrier 217 such that pad 219 is now in contact with metal layer 215 on the point of highest elevation (the bump). Anodic current is supplied to the metal layer 215 on the wafer. Since the metal bump is now exposed to electrolyte (flowing through pad 219) the electrolytic circuit is closed, and electropolishing begins only on that raised region in the metal layer topography. See 209.

Preferably anodic current is supplied to metal layer 215 via a wafer holder capable of supplying such current. Alternatively, an apparatus in which the anodic current is supplied to the wafer via a mechanism separate from the wafer holder may be used.

Figure 2D:
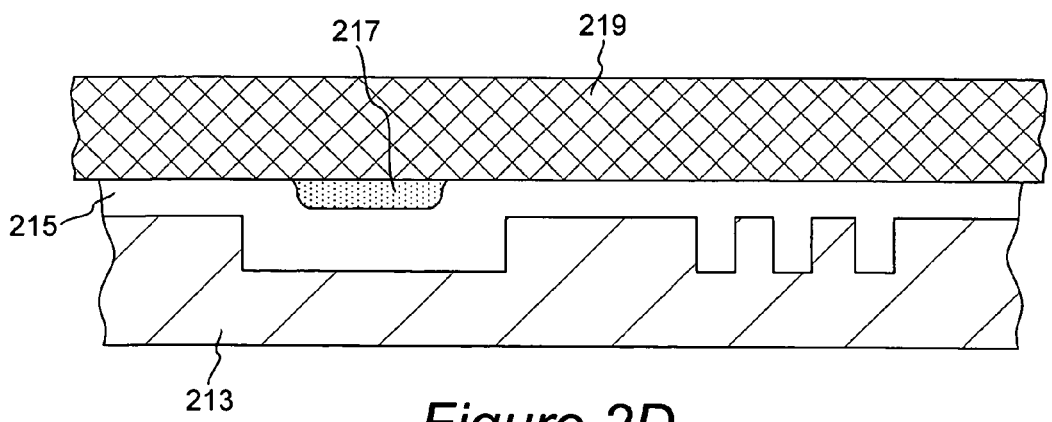

Referring to FIG. 2D, as electropolishing continues, the bump is completely removed, and a new level of planarization is achieved. During electropolishing, the distance between the pad and the wafer may be continually adjusted to maintain a uniform rate of material removal (be it mechanical removal of diffusion barrier 217 or electropolishing of metal layer 215). See 210. In this case, that means constant contact of the pad and the wafer. Alternatively, the material properties of the pad can afford self-regulating local height over the wafer surface. While not wishing to be bound by theory, when the pad is placed in contact with the wafer, the counter force resisting the pads presence (proportional to some spring constant of the pad material) gets larger as the pad is compressed. The amount of interfacial contact area between the wafers recessed regions and the pad increases with higher compression of the pad against the wafer, and decreases with lower compression of the pad against the wafer. Since the relevant dimensions of the wafer topography are on the order of 1 μm in depth, pad contact on the raised regions, and not in the recesses, is possible because of the pad's local distance adjusting properties.

In methods where proximity is the desired relative position of the pad and the wafer, then a specified distance is maintained or controlled via feed back from a sensor that determines the actual distance between the two work surfaces as material is removed.

Referring again to FIG. 2D, since a portion of diffusion layer 217 remains in the recessed region of metal layer 215, metal underlying this remaining portion does not begin the electroplating process yet, and only surrounding regions of the metal layer are electropolished.

Figure 2E:
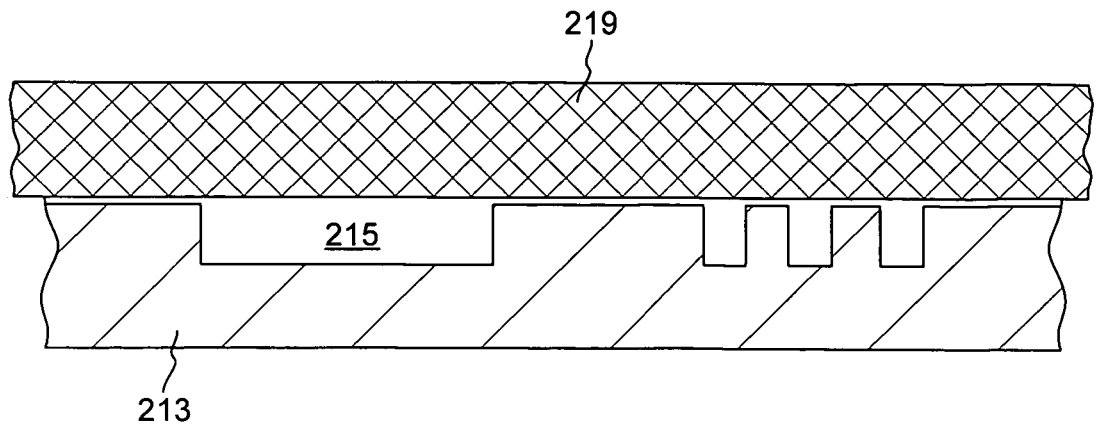

Referring to FIG. 2E, electropolishing is continued until all or a majority of the metal layer is removed from the field of the wafer. Note that diffusion barrier 217 is completely removed, and metal layer 215 is planarized. The current is stopped at a point when all of the desired metal is removed, and the method is done. See 211.

Figure 2F:
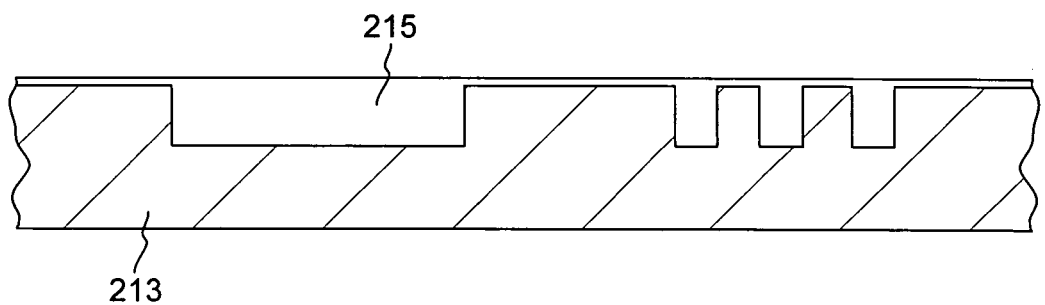
Figure 2G:
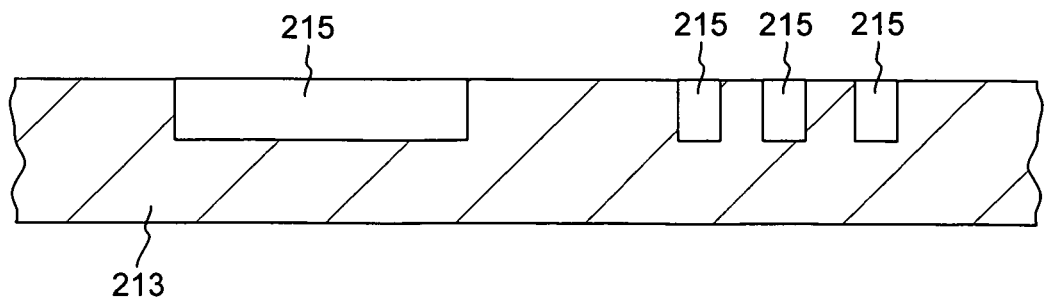

FIG. 2F depicts the wafer substrate after complete planarization, when a majority of the metal is removed. This result may be desirable in some instances, such as when use of a particular CMP process is desired to remove the remaining metal from the field. Preferably, planarization is continued using method 200 until metal layer 215 is completely removed from the field. See FIG. 2G.

As mentioned, some methods of the invention planarize a metal layer on a substrate through an iterative process. For example, one embodiment of the invention is a method of electrochemically planarizing a metal layer deposited on a wafer. An example embodiment of this method will be discussed in conjunction with FIGS. 3A-J.

Figure 3A:
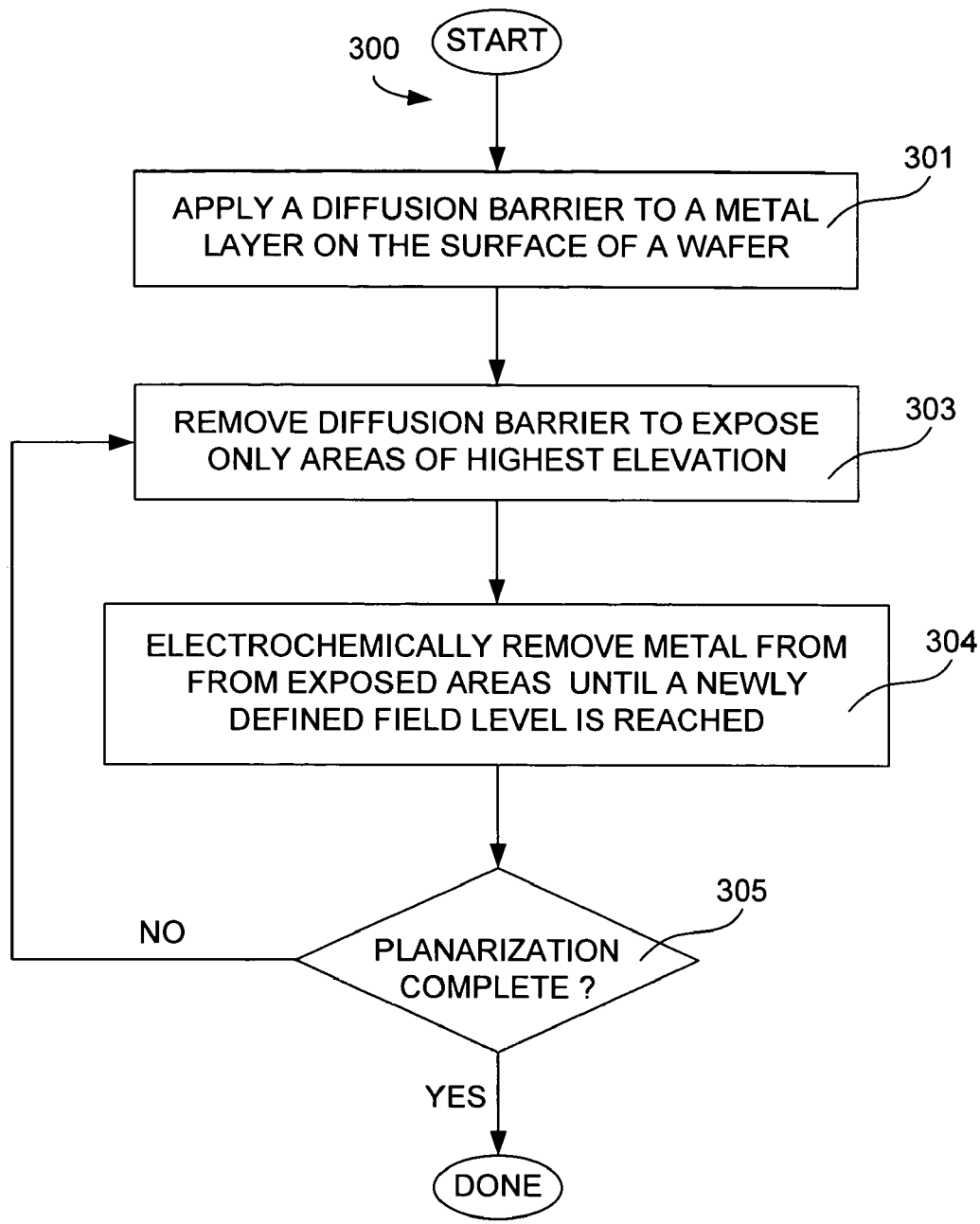
FIG. 3A is a flow chart describing a method in accordance with aspects of the invention.

FIG. 3A is a flow chart depicting a method, 300, for planarizing a metal layer in accordance with the invention. First a diffusion barrier is applied to a metal layer on the surface of a wafer. See 301. Next, a portion of the diffusion barrier is removed to expose only areas of the metal layer of highest elevation in the metal profile. See 303.

Figure 3B:
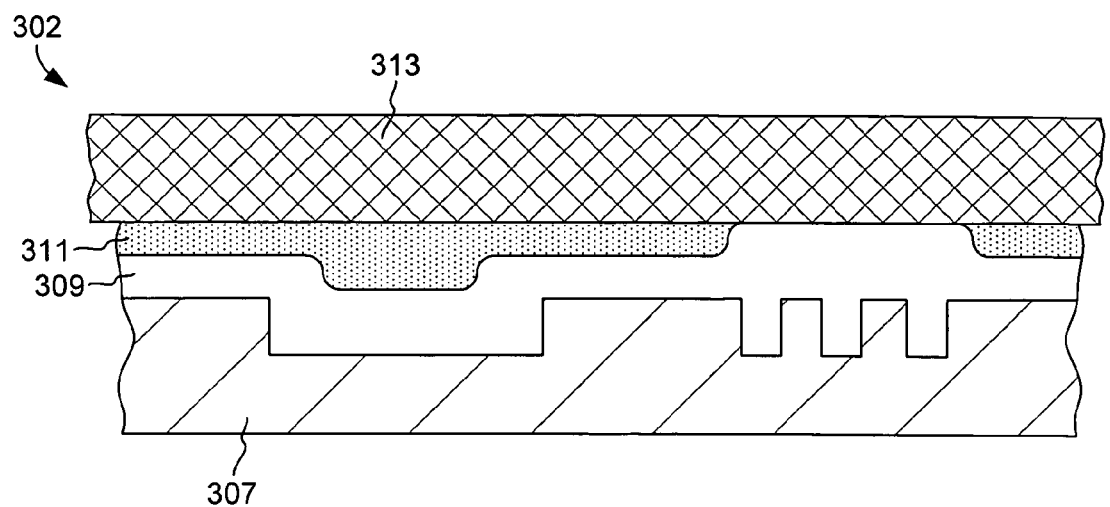
FIGS. 3B-J depict representative wafer substrates described in conjunction with the method in FIG. 3A.

FIG. 3B depicts a scenario, 302, where this selective removal of the diffusion barrier from the area of highest elevation takes place. Dielectric layer 307 has a metal layer 309 deposited thereon. As in previous examples, metal layer 309 contains a recessed region and raised region in its topological profile. A diffusion barrier, 311, has been deposited and as just described, partially removed to expose the region of highest elevation (at the interface of pad 313 and metal layer 309). Diffusion barrier film, 311, can be any of those described in accordance with the invention, that is, a viscous liquid or solid as described in detail above.

Figure 3C:
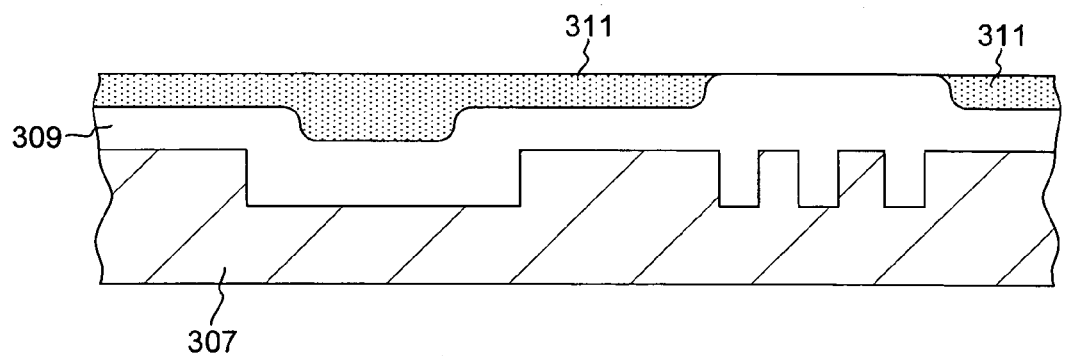

In this case, electropolishing pad 313 was used to partially remove diffusion barrier 311. Chemical mechanical polishing pads can also be used. As mentioned, depending on the specific method employed, diffusion barrier 311 may be either a solid or a viscous liquid and either ionically conductive or not. Pad 313 may be abrasive or not. Additionally, a pad need not be used to remove the diffusion barrier in method 300. The barrier can be partially removed by exposure to a solvent in which the barrier is soluble. For example a polyvinylidene difluoride (PVDF) diffusion barrier may be thinned or partially removed by using dimethylformamide (DMF) or 1-methyl-2-pyrrolidinone (NMP) as a solvent, or an ethylene propylene diene monomer (EPDM) diffusion film may be thinner or partially removed by using cyclohexane as a solvent. Given either scenario, FIG. 3C depicts the wafer after the diffusion barrier has been partially removed to expose the region of highest elevation in the metal layer profile. In this case, contact of pad 313 with the wafer is ceased.

Continuing with method 300, the wafer depicted in FIG. 3C is now subjected to some form of electrochemical (e.g. electropolishing) metal removal. Given the nature of diffusion barrier 311, only the exposed area of metal layer 309 will be etched. This etching is continued until a defined field level is reached. See 304.

Determination of specific endpoints for electropolishing (for example) can be made in many ways. For example, by knowing the rate of metal removal and the desired thickness to be removed, the exposed regions can be exposed to the electropolishing for a defined period of time or the amount of current needed to etch to a particular depth can be calculated. One skilled in the art would understand that there are many such methods for accurate endpoint detection.

Figure 3D:
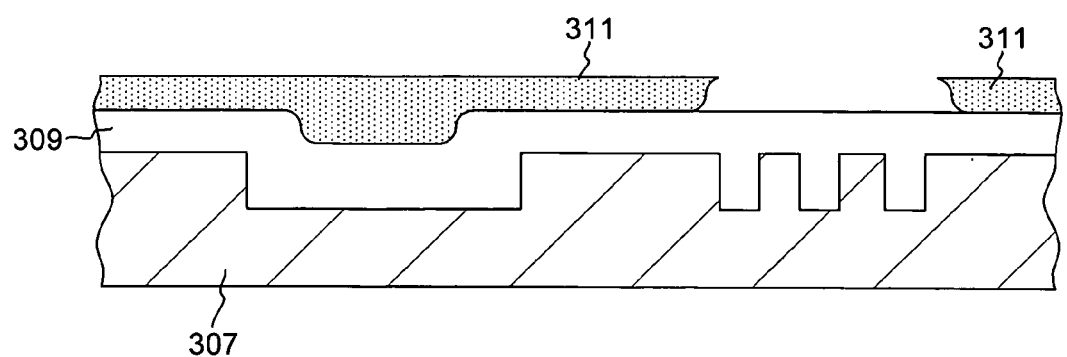

FIG. 3D depicts the wafer substrate after the first iteration of block 304. In this case, the "bump" has been removed, and a recess remains in the portion if diffusion barrier 311 that the bump once occupied. There are now two portions of diffusion barrier film 311 as depicted.

Figure 3E:
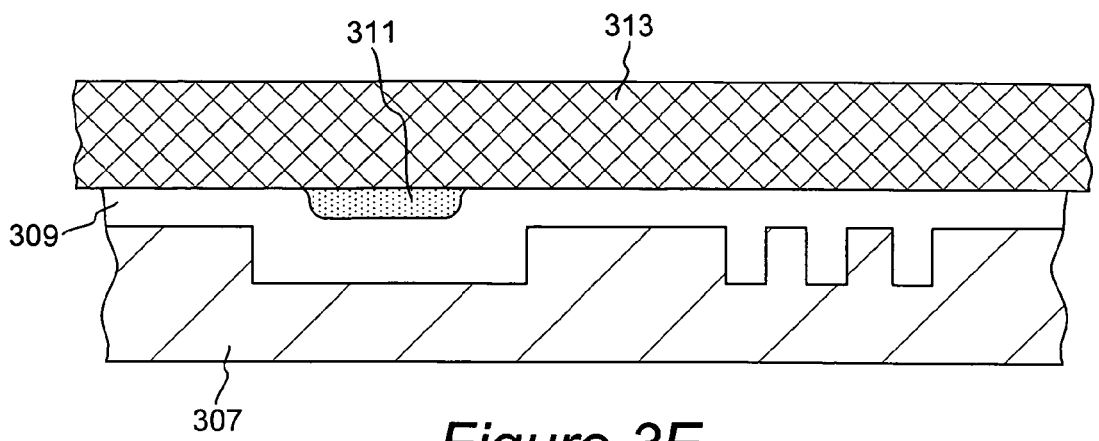

Referring again back to FIG. 3A, after the desired thickness of metal has been removed, to define a new field level elevation on the metal profile, a decision must be made. See 305. If the planarization is complete, then the method is done. If the planarization is not complete, then the method returns to block 303. That is, once again, a portion of diffusion barrier 311 is removed to expose only areas of highest elevation in metal layer 309. Analogous to FIG. 3A, FIG. 3E, depicts this scenario when electropolishing pad 313 is once again used to remove a portion of barrier 311 on the wafer (as depicted in FIG. 3D). Again, this removal could be effected with a solvent as well. After removal of a portion of barrier 311, pad 313 is removed, leaving a planar surface now having barrier 311 remaining only in the recess of metal layer 309, see FIG. 3F.

Figure 3F:
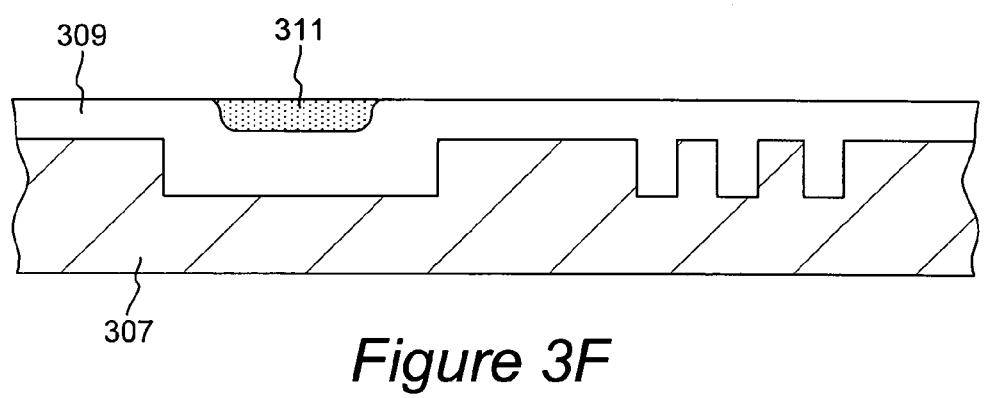
Figure 3G:
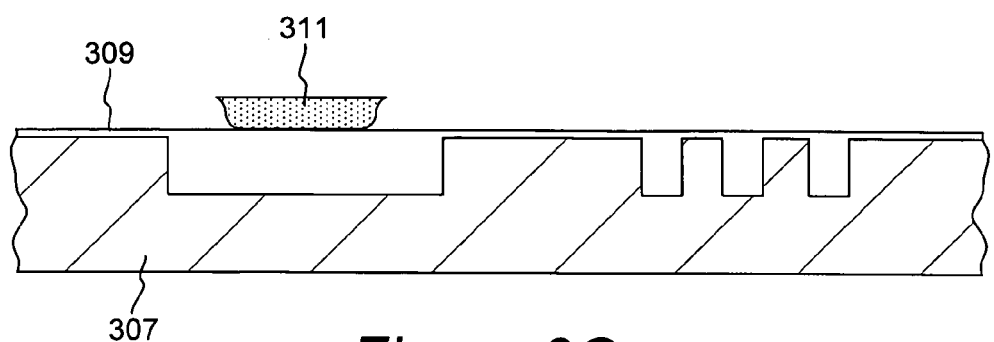

Referring back to method 300, starting from the substrate in FIG. 3F, block 304 is repeated (e.g. electropolishing to remove a portion metal layer 309) until a new field level is defined. The result is depicted in FIG. 3G. This time, that portion of metal layer 309, which surrounded that portion of diffusion barrier 311 in the recess, was removed. This leaves a portion of barrier 311 on the planarized surface of metal layer 309.

Figure 3H:
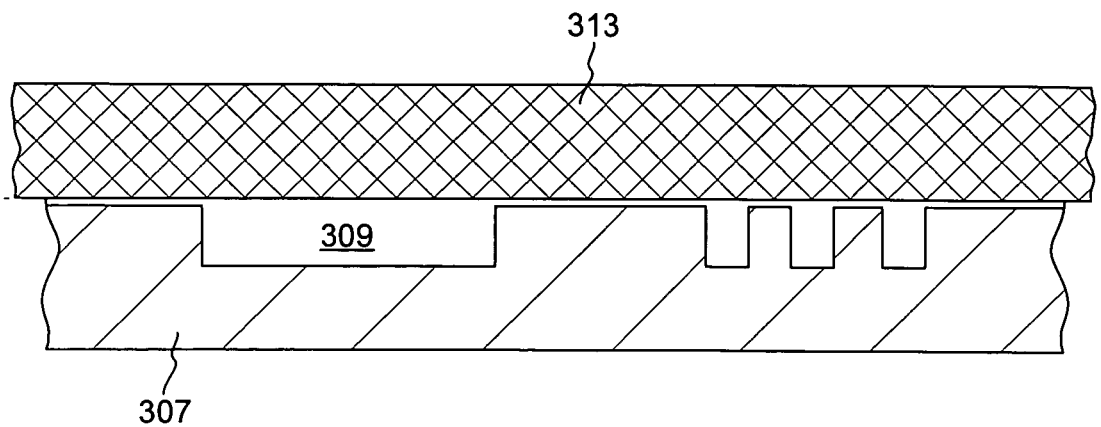
Figure 3I:
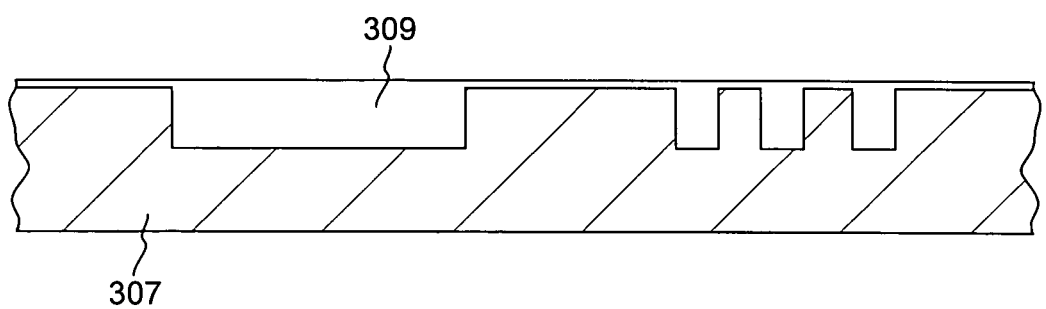
Figure 3J:
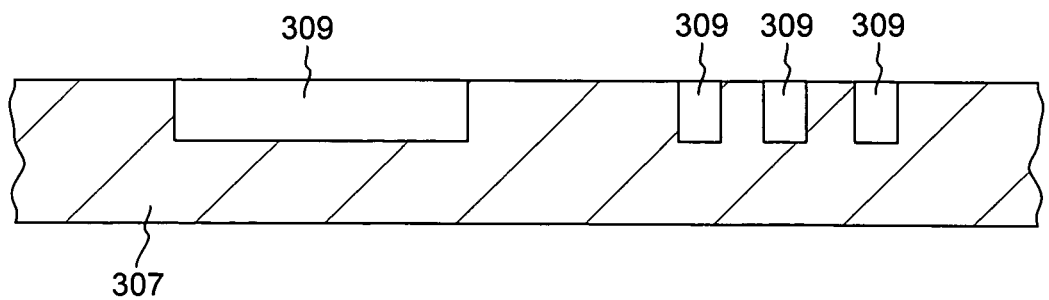

Again, referring to decision block 305, if the planarization is complete then the method is done, if not, block 303 is repeated. FIG. 3H shows the result, when pad 313 is once again contacted with the wafer surface to remove the remaining portion of diffusion barrier 313. The resultant substrate after the pad is removed is depicted in FIG. 3I. Metal layer 309 is now planarized, and has no diffusion barrier on its surface. However as mentioned, in many instances it is preferable to continue the planarization process until the metal layer is removed to a point in which the high and low aspect features of dielectric 307 are filled with metal 309 (electrically isolated from one another) and the surface of the wafer is planarized. See FIG. 3J.

As mentioned, another aspect of the invention is an electropolishing apparatus for removing a portion of a metal layer disposed on a wafer. Further details of such apparatus are described in conjunction with FIGS. 4A-B.

Figure 4A:
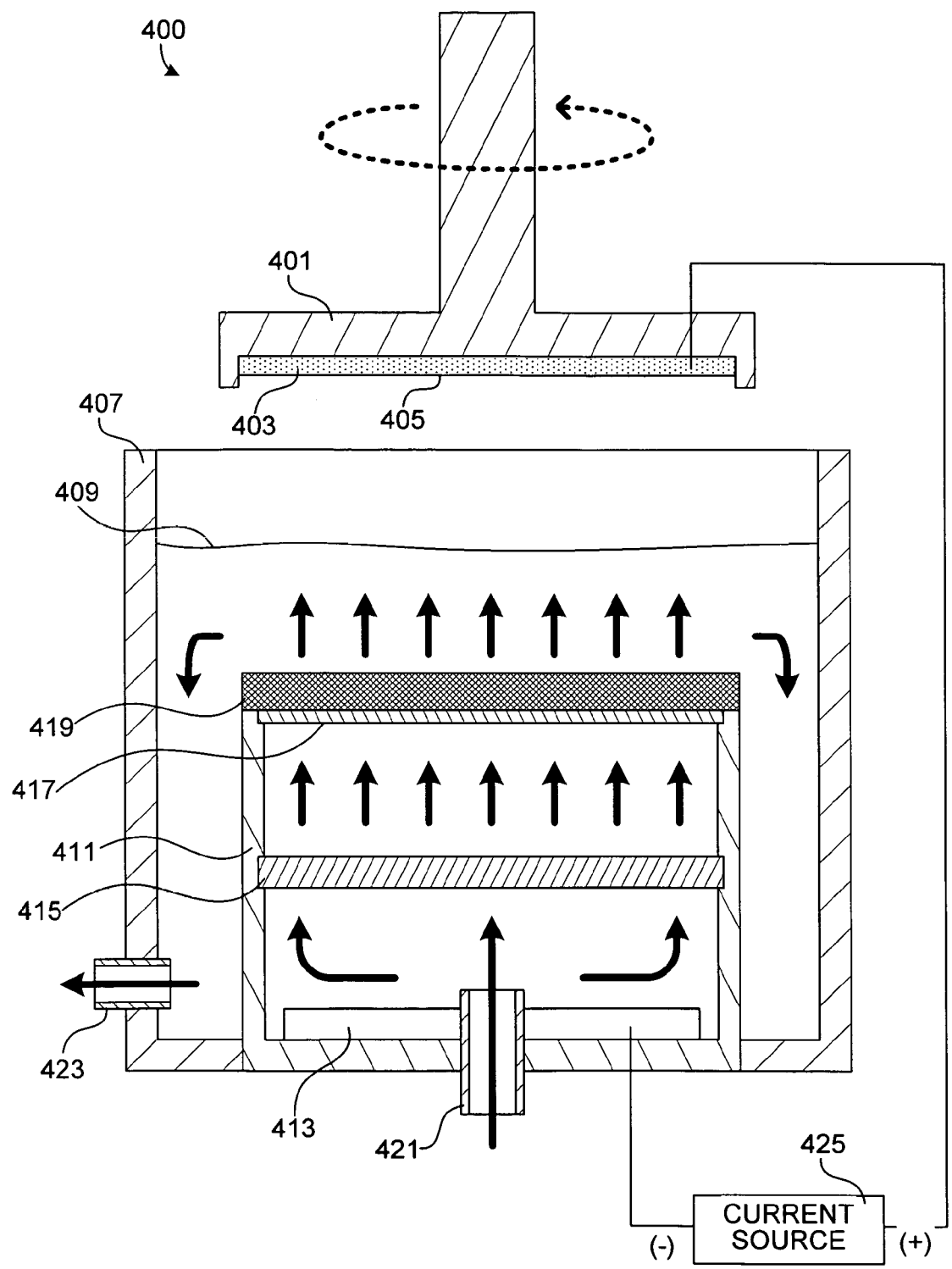
FIGS. 4A-B depict an apparatus in accordance with aspects of the invention.

FIG. 4A depicts a simplified cross-sectional view of an electropolishing apparatus, 400, of the invention. Electropolishing apparatus 400 has a wafer holder 401 which holds wafer 403. Note, that the concept of a "wafer holder" extends generally to various combinations and subcombinations of components that engage a wafer and allow its movement and positioning. Wafer 403 has a work surface 405 having a metal layer thereon. Wafer holder 401 provides a number of positioning capabilities for wafer 403 including rotation of wafer 403 about an axis perpendicular to its work surface (as depicted by the arrow around a portion of 401). Wafer holder 401 can lift wafer 403 bidirectionally along the same axis (perpendicular to the work surface) in order to immerse and withdraw the wafer from an electrolytic cell. Wafer holder 401 also provides back side protection to the wafer so that contaminating metal ions cannot reach the back side of the wafer during electrochemical processing. Also, wafer holder 401 makes electrical contact (via a plurality of electrical contacts) with wafer 403 at the outermost edge of work surface 405 (e.g. via a metal seed layer thereon). Current is supplied via a current source 425, in this case the wafer's metal layer is the anode.

Since the electrical contacts are located at the outermost perimeter of work surface 405, they are outside the usable plated or polished area of the worksurface. An example of a wafer holder having these capabilities is the "clamshell" device, available from Novellus Systems, Inc. A more detailed description of the movement capabilities and associated hardware of the clamshell apparatus is described in U.S. patent application Ser. No. 09/872,341 incorporated by reference herein for all purposes. Such apparatus allow interaction of the electropolishing pad of the invention with wafer work surface 405, without interfering with the electrical contacts on the wafer surface. As well, the clamshell provides exposure of the wafer work surface, while protecting the backside of the wafer from contamination by electrolyte.

Alternatively, an electropolishing apparatus of the invention can have both cathode and anode electrical connections that are separate from the wafer holder. For example, a polishing pad/cathode combination with a contacting "brush" electrode which moves with the pad and makes anodic contact to the wafer's metal layer.

The work surface of the wafer, 405, faces downward toward an electropolishing cell 407 (in FIG. 4A the wafer holder has not yet immersed wafer 403 into the cell). Cell 407 is filled with electrolyte 409, and has an inner cell assembly 411. Assembly 411 contains a cathode 413, a diffuser membrane 415, a structural support 417, and an electropolishing pad 419. The flow pattern of electrolyte 409 is depicted by the heavy dark arrows. Electrolyte 409 enters cell 407 via an inlet 421. Once the electrolyte exits inlet 421, it is inside the cathode chamber (the area inside inner cell 411 and between diffuser membrane 415 and cathode 413. The electrolyte passes through diffuser membrane 415, which creates a uniform laminar flow in the electrolyte, as depicted. The electrolyte passes through a porous support structure 417 and through electropolishing pad 419. The uniform laminar flow of electrolyte that exits pad 419 will impinge on wafer 405, once the wafer is immersed into the electrolyte. The electrolyte then flows around inner cell 411 as indicated, and out of electropolishing cell 407 via outlet 423.

The area inside inner cell 411, between diffuser membrane 415 and pad 419 is a fluid flow manifold area. Diffuser membrane 415 can be used when pad 419 does not have sufficient flow resistance to yield the required flow uniformity. As mentioned, below the flow manifold is the cathode chamber containing cathode 413. In FIG. 4A, a single flow loop is depicted, i.e. containing the cathode chamber, followed by the fluid flow manifold, and then a main polishing bath. Alternatively, separate flow loops can be used to allow one to independently control the convection over the cathode and wafer (anode). Finally, the electrolyte used in the cathode chamber can be different than in the polishing chamber when a cathode membrane is used (similar to that currently employed in the Sabre separated anode chamber design, available from Novellus Systems, Inc. of San Jose, Calif.). In this case, an electrolyte optimal for plating on the cathode can be combined with another electrolyte best suited for electropolishing. Material management (particularly copper concentration control) can be handled in a manner similar to that described in U.S. patent application Ser. No. 09/706,272 entitled, "Copper Electroplating Apparatus and Method"; and U.S. patent application Ser. No. 09/927,740 entitled, "Methods and Apparatus for Controlling Electrolyte Flow for Uniform Plating" which are herein incorporated by reference for all purposes.

In particular to the invention, the polishing electrolyte should contain dissolved copper ions. This is particularly usefully in enabling the counter electrode (cathode) to create a balanced chemical reaction for the generation and consumption of copper in the tool, thereby avoiding hydrolyses and gas generation. Examples of suitable copper containing electrolytes include various water-containing solutions of phosphoric acid, sulfuric acid, or pyrophosphate, and alkaline baths containing copper complexing agents such as citrate of EDTA. Use of supporting electrolyte cations, such as tetramethylmmonium or tetraethlyammonium cation, are useful in alkaline baths as supporting electrolytes. In one particularly preferred embodiment, the bath contains between about 30 and 80% by weight phosphoric acid, with between about 0.1M and near-saturated copper phosphate (the saturation concentration is a function of water content).

Figure 4B:
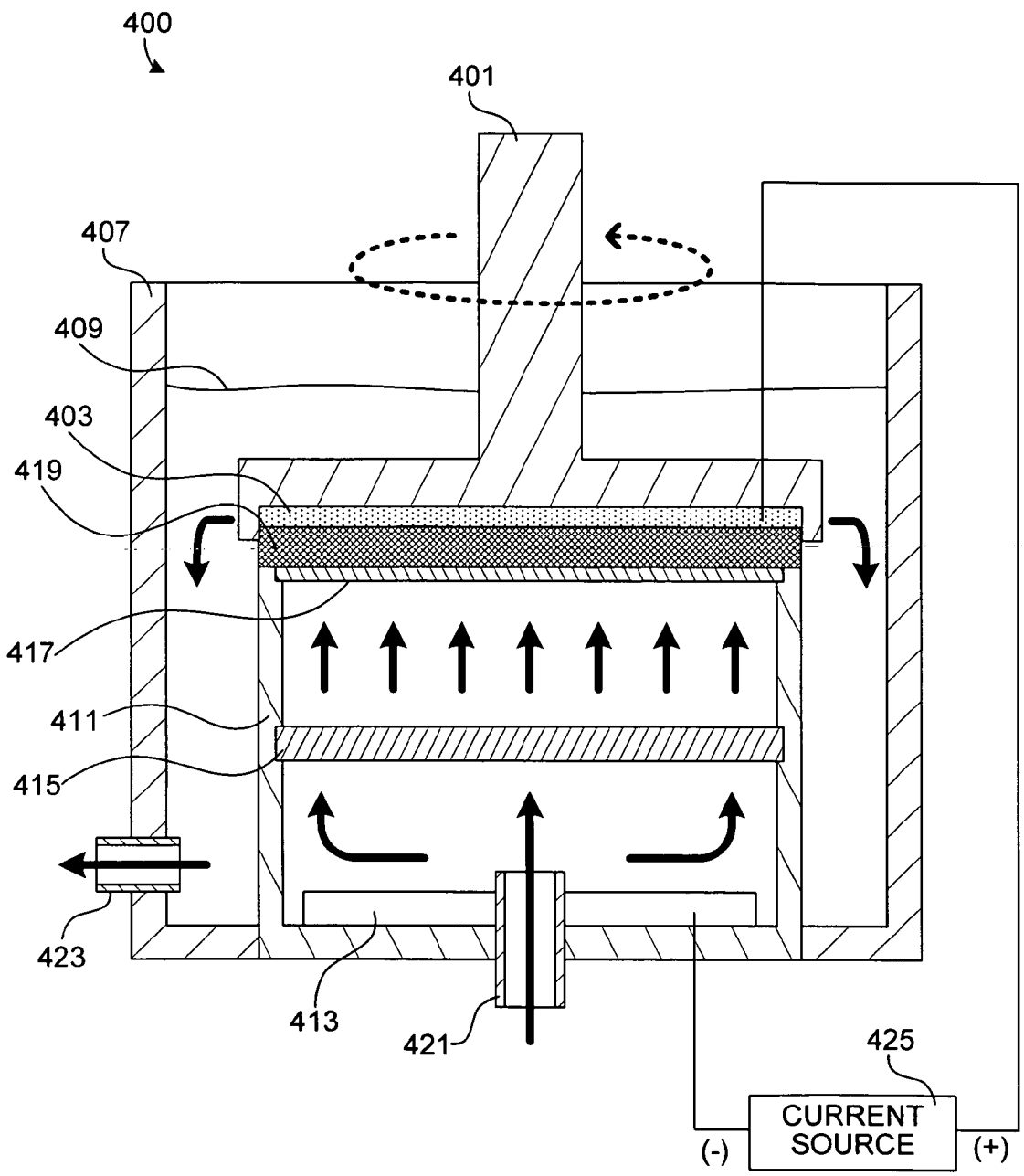

FIG. 4B depicts apparatus 400 with wafer in contact with electropolishing pad 419, in accordance with some methods of the invention. The pad is dimensioned in such a way as to complement the shape of wafer holder 401. In this case, the entire work surface of the wafer is contacted by the pad. During electropolishing methods of the invention and using apparatus 400, the wafer's entire usable surface is planarized.

Although not depicted, wafer holder 401 may have electrolyte flow channels about the perimeter of the portion that clamps the wafer in place. This allows used electrolyte and any ablated diffusion barrier material to pass out of the interface of the pad and the wafer in favor of fresh electrolyte passing through the pad and impinging on the wafer surface. Although FIGS. 2A-G and FIGS. 3A-J suggest the electropolishing pad moving down onto the wafer surface, in this case the wafer is lowered onto the pad.

One problem sometimes encountered during electropolishing is that bubbles formed at the cathode or otherwise introduced into the solution can migrate (rise in the vertical arrangement) to the solution surface, or settle on the wafer (anode) surface while it is immersed. These bubbles will cause local non-uniformities in the anode surface (e.g., unpolished or overpolished spots). To address this problem, various apparatus to eliminate bubbles from the fluid are introduced. Such apparatus are described in U.S. patent application Ser. No. 09/872,340 entitled "Method and Apparatus for Bubble Remove in Wafer Wet Processing", naming E. Patton, D. Smith, J. Reid, and S. Mayer as inventors, which is incorporated herein by reference for all purposes. Note, that although the pad itself will tend to keep bubbles from staying at any one point on the wafer surface for any length of time, the fluid flow through the pad may bring extraneous bubbles in the electrolyte into the pad material. By using bubble removal apparatus as referenced above, this problem is drastically reduced.

Because a significant amount of heat can be generated inside the apparatus, the temperature of the cell will rise during its use if means for the removal of this heat are not available. Generally, the cell temperature changes the rate and operating voltage of electropolishing. Therefore, to maintain a controlled electropolishing rate, it may be necessary to install a heat exchange mechanism for this system. Two possible embodiments are to have cooling coils inside the bath or to cool the electrolyte externally of the cell, e.g., combining or replacing a filtration line with a cooling chamber or a refrigerated electrolyte reservoir.

Preferably the voltage of the cell be controlled by a "three electrode system". In such a system, the voltage of the anode is set and maintained with respect to an unpolarized reference electrode, but the anode surface voltage is driven by varying the potential of the cathode. Such a system ensures the electrochemical stability of the anode interface from being thrown into a potential regime where unwanted side reactions occur (e.g., oxygen evolution at the anode), as well as provides a controlled approach to surface film formation and steady state electropolishing.

The electropolishing cell may be equipped to provide for end point detection and current shut-off. As mentioned, it is generally desirable to leave a small amount of metal on the workpiece because the polishing rate for isolated structures (such as embedded lines) can be much greater than for a surface completely covered with the metal being polished. In some cases, if the metal of the unpatterned areas is permitted to clear, the embedded, planarized features may be etched more than desired.

One method of end-point detection and current shut off is simply monitoring the current versus time for a potentiostatic process. After an initial transition period (10-100 second depending on processing conditions such as rotation rate and temperature), the current of potentiostatically controlled electropolishing reaches a steady state value. As long as copper is present everywhere on the surface (continuous over the wafer work surface), that value remains essentially unchanged. As the part clears of copper, the current drops. By monitoring the change in current with time, one can observe decrease in current at the end of the process and avoid overpolishing the part.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of electrochemically or chemically planarizing a metal layer deposited on a wafer, the method comprising:
   (a) applying an electrolyte-soluble or etching solution-soluble kinetically limiting surface material to a metal layer on the surface of a wafer, wherein the kinetically limiting surface material comprises a compound selected from the group consisting of imidazole and its derivatives;
   (b) selectively removing the soluble kinetically limiting surface material to expose only areas of highest elevation of the metal layer by a non-abrasive process; and
   (c) selectively electrochemically or chemically removing metal from the exposed regions of the metal layer to reduce elevation variation of said layer.

2. The method of claim 1, wherein at least some of the kinetically limiting surface material is removed via mechanical removal with a non-abrasive polishing pad.

3. The method of claim 1, wherein operation (b) comprises rubbing the kinetically limiting surface material with a non-abrasive porous pad.

4. The method of claim 1, wherein the kinetically limiting surface material is an electrochemical kinetically limiting surface material.

5. The method of claim 1, wherein the kinetically limiting surface material is applied to form a layer of at most few monolayers in thickness.

6. The method of claim 1, wherein the same apparatus is used to remove the kinetically limiting surface material and the metal.

7. The method of claim 1, wherein the kinetically limiting surface material is applied to the metal layer while metal is being removed from the layer.

8. The method of claim 1, wherein the metal comprises copper.

9. The method of claim 1, wherein the kinetically limiting surface material comprises a compound selected from the group consisting of 4-methylimidazole, 1-phenyl-4-methylimidazole and 1-(p-tolyl)-4-methylimidazole.

10. The method of claim 1, wherein (b) and (c) are repeated iteratively until a predetermined degree of planarization of the metal layer is achieved.

11. The method of claim 1, wherein the metal layer deposited on the wafer comprises regions of varied elevation, and wherein
   (a) comprises applying the kinetically limiting surface material to the regions of varied elevation;
   (b) comprises selectively removing the kinetically limiting surface material to expose only areas of highest elevation of the metal layer, while preserving the kinetically limiting surface material on at least some of the regions of lower elevation; and wherein
   (c) comprises removing metal at a faster rate from the exposed regions of the metal layer as compared to the regions comprising the kinetically limiting surface material residing thereon.

12. The method of claim 1, wherein (c) comprises selectively electrochemically removing metal from the exposed regions of the metal layer.

13. The method of claim 1, wherein (c) comprises selectively removing metal from the exposed regions by chemical wet etching.

14. The method of claim 1, wherein (b) comprises selectively agitating and removing the soluble kinetically limiting surface material without contacting the wafer surface with a pad.

15. A method of electrochemically planarizing a metal layer deposited on a wafer, the method comprising:
   (a) applying an electrolyte-soluble material to a metal layer on the surface of a wafer, wherein the electrolyte-soluble material comprises benzotriazole;
   (b) selectively removing the benzotriazole to expose only areas of highest elevation of the metal layer by a non-abrasive process; and
   (c) selectively electrochemically removing metal from the exposed regions of the metal layer to reduce elevation variation of said layer.

16. The method of claim 15, wherein the same apparatus is used to remove the benzotriazole and the metal.

17. The method of claim 16, wherein the metal comprises copper.

* * * * *